(12) United States Patent
Gorek et al.

(10) Patent No.: US 10,042,076 B2
(45) Date of Patent: Aug. 7, 2018

(54) RESISTIVITY IMAGING USING COMBINATION CAPACITIVE AND INDUCTIVE SENSORS

(71) Applicant: Baker Hughes, a GE company, LLC, Houston, TX (US)

(72) Inventors: Matthias Gorek, Hannover (DE); Martin Folberth, Hannover (DE); Eduard Kirchmeier, Adelheidsdorf (DE)

(73) Assignee: Baker Hughes, a GE company, LLC, Houston, TX (US)

( * ) Notice: Subject to any disclaimer, the term of this patent is extended or adjusted under 35 U.S.C. 154(b) by 0 days.

(21) Appl. No.: 15/349,224

(22) Filed: Nov. 11, 2016

(65) Prior Publication Data

US 2017/0139073 A1 May 18, 2017

Related U.S. Application Data

(60) Provisional application No. 62/255,118, filed on Nov. 13, 2015.

(51) Int. Cl.
*G01V 3/28* (2006.01)
*G01R 15/16* (2006.01)

(52) U.S. Cl.
CPC ............ *G01V 3/28* (2013.01); *G01R 15/165* (2013.01)

(58) Field of Classification Search
CPC ................. G01R 15/165; G01V 3/28
(Continued)

(56) References Cited

U.S. PATENT DOCUMENTS

| 4,853,617 A * | 8/1989 | Douglas ................ G01V 3/08 |
| | | 324/329 |
| 7,066,282 B2 | 6/2006 | Chen et al. |

(Continued)

FOREIGN PATENT DOCUMENTS

| WO | WO 9503557 A1 * | 2/1995 | ............ G01V 3/20 |
| WO | 0177711 A1 | 10/2001 | |

(Continued)

OTHER PUBLICATIONS

Ellis, et al; "Well logging for earth scientists"; 2007; Springer, 2nd Edition; Chapter 7-9: Induction devices—propagation measurements; 96 pages.

(Continued)

*Primary Examiner* — Jay Patidar
(74) *Attorney, Agent, or Firm* — Cantor Colburn LLP

(57) ABSTRACT

A system for measuring electric characteristics of an earth formation includes a carrier configured to be disposed in an earth formation, and an inductive measurement assembly including an antenna configured to generate an oscillating magnetic field in the earth formation and measure a resistivity of the formation by detecting a signal in response to currents induced in the formation. The system also includes a capacitive measurement assembly including a capacitive measurement electrode configured to detect a signal in response to a measurement current injected into the formation, the capacitive measurement electrode disposed between the antenna and the formation and in a path of the magnetic field, the capacitive measurement electrode formed from a plurality of constituent electrodes that are electrically isolated from each other so as to prevent induction of eddy currents across the plurality of electrodes.

20 Claims, 10 Drawing Sheets

(58) Field of Classification Search
USPC .................................................. 324/333–375
See application file for complete search history.

(56) References Cited

U.S. PATENT DOCUMENTS

| | | | |
|---|---|---|---|
| 2005/0133262 A1* | 6/2005 | Chen ........................ | G01V 3/24 175/40 |
| 2006/0103389 A1 | 5/2006 | Bespalov et al. | |
| 2008/0068024 A1 | 3/2008 | Gold et al. | |
| 2008/0068025 A1* | 3/2008 | Gold ........................ | G01V 3/24 324/367 |
| 2008/0088313 A1 | 4/2008 | Forgang et al. | |
| 2010/0026305 A1* | 2/2010 | Yanzig ..................... | G01V 3/20 324/355 |
| 2010/0123461 A1* | 5/2010 | Folberth .................. | G01V 3/28 324/339 |
| 2015/0160365 A1* | 6/2015 | Donderici ........... | E21B 47/0905 324/351 |

FOREIGN PATENT DOCUMENTS

WO         02086459 A1    10/2002
WO    2010059540 A2     5/2010

OTHER PUBLICATIONS

International Search Report and the Written Opinion of the International Searching Authority; PCT/US2016/061637; Korean Intellectual Property Office; dated Feb. 23, 2017; 13 pages.

* cited by examiner

RESISTIVITY IMAGING USING COMBINATION CAPACITIVE AND INDUCTIVE SENSORS

CROSS REFERENCE TO RELATED APPLICATIONS

This application claims the benefit of an earlier filing date from U.S. Provisional Application Ser. No. 62/255,118 filed Nov. 13, 2015, the entire disclosure of which is incorporated herein by reference.

BACKGROUND

Geologic formations below the surface of the earth may contain reservoirs of oil and gas, which are retrieved by drilling one or more boreholes into the subsurface of the earth. The boreholes are also used to measure various properties of the boreholes and the surrounding subsurface formations.

Resistivity imaging tools are used in the energy industry to estimate properties of subterranean formations and evaluate formations to determine potential hydrocarbon production. Resistivity tools, such as oil-based mud (OBM) imaging tools are useful in formation evaluation for, e.g., differentiating between hydrocarbon and non-hydrocarbon fluids and measuring formation features such as lithology and fracture characteristics.

SUMMARY

An embodiment of a system for measuring electric characteristics of an earth formation includes a carrier configured to be disposed in an earth formation, and an inductive measurement assembly including an antenna configured to generate an oscillating magnetic field in the earth formation and measure a resistivity of the formation by detecting a signal in response to currents induced in the formation by the magnetic field. The system also includes a capacitive measurement assembly including a capacitive measurement electrode configured to detect a signal in response to a measurement current injected into the formation, the capacitive measurement electrode disposed at least approximately at the same axial and angular location of the carrier as the antenna and disposed between the antenna and the formation and in a path of the magnetic field, the capacitive measurement electrode formed from a plurality of constituent electrodes that are electrically isolated from each other so as to prevent induction of eddy currents across the plurality of electrodes.

An embodiment of a method of measuring electric characteristics of an earth formation includes disposing a carrier in a borehole in an earth formation, the carrier including a measurement tool having an inductive measurement assembly and a capacitive measurement assembly, the inductive measurement assembly including an antenna, the capacitive measurement assembly including a capacitive measurement electrode disposed at least approximately at the same axial and angular location of the carrier as the antenna and disposed between the antenna and the formation and in a path of a magnetic field generated by the antenna, the capacitive measurement electrode formed from a plurality of constituent electrodes that are electrically isolated from each other so as to prevent induction of eddy currents across the plurality of electrodes. The method also includes generating an oscillating magnetic field in the earth formation by the antenna and detecting a signal in response to currents induced in the formation by the magnetic field, injecting a measurement current into the formation and detecting a change in the measurement current by the capacitive measurement electrode, and estimating a resistivity of the formation based on detecting the signal and detecting the change in the measurement current.

BRIEF DESCRIPTION OF THE DRAWINGS

The following descriptions should not be considered limiting in any way. With reference to the accompanying drawings, like elements are numbered alike.

DETAILED DESCRIPTION

Apparatuses and methods are provided for performing resistivity measurements of an earth formation are described herein. An embodiment of a resistivity measurement apparatus or system includes a downhole tool (e.g., a wireline or LWD tool) that provides resistivity measurements utilizing both inductive and capacitive measurements. The inductive measurements are performed by one or more sensors, each of which combines both inductive and capacitive sensing that can be performed at the same location in a borehole. In one embodiment, the sensor includes an inductive measurement assembly having an antenna (e.g., a single loop sensor), and a capacitive measurement assembly having at least one capacitive electrode that is co-located relative to the antenna. In one embodiment, the inductive measurement antenna and the capacitive sensing electrode are located so that they have at least substantially the same axial and angular location. An embodiment of an electromagnetic sensor includes an inductive sensor including an antenna and a capacitive galvanic sensor having a co-located electrode that is located in the path of a magnetic field generated by the inductive sensor and is divided into multiple constituent parts. The constituent parts (also referred to as constituent electrodes) are not physically connected within the path of the magnetic field (at least to prevent induction of eddy currents around the constituent electrodes), in order to reduce currents in the capacitive electrode and reduce or minimize effects of the capacitive electrode on the magnetic field and associated inductive resistivity measurements.

Figure 1:
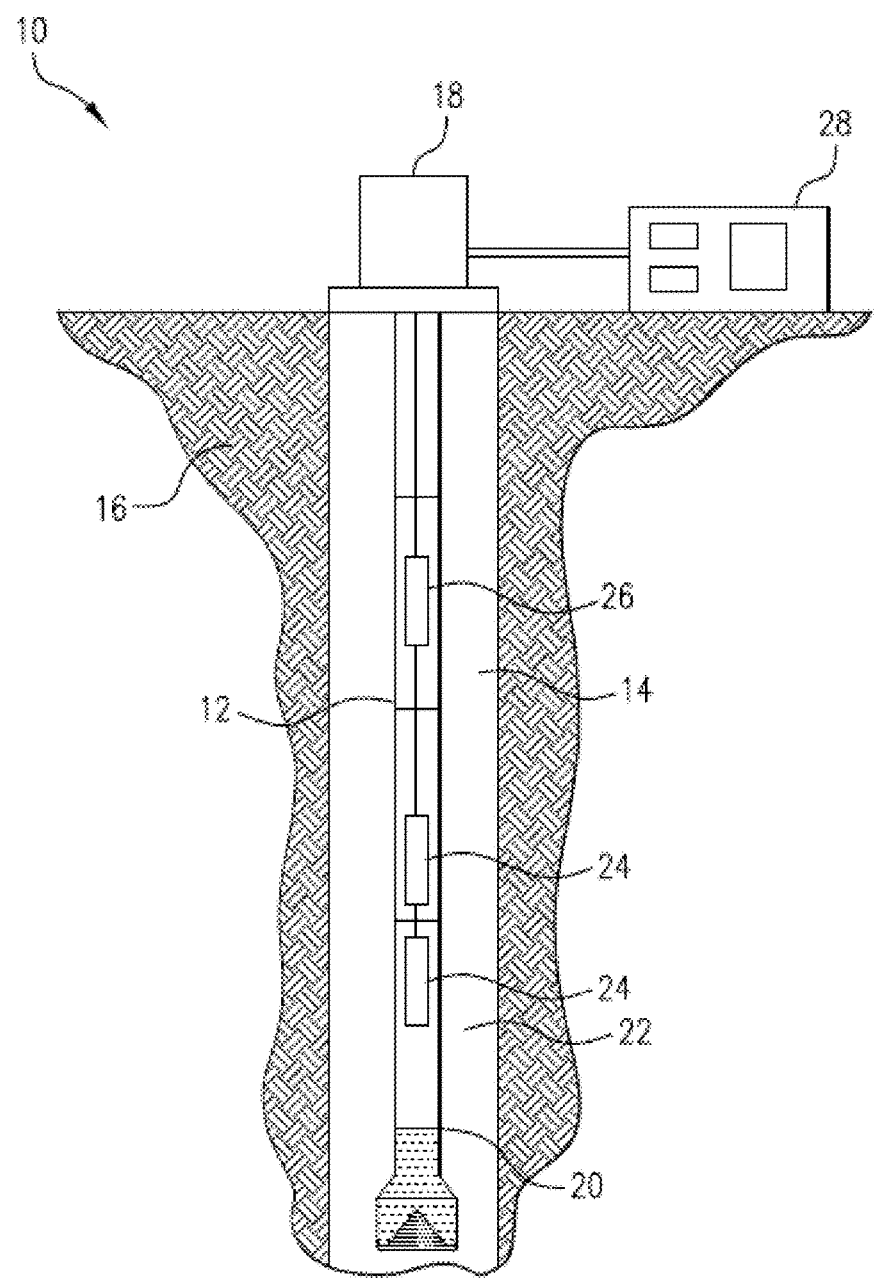
FIG. 1 depicts an embodiment of a drilling, formation evaluation and/or production system.

Referring to FIG. 1, an exemplary embodiment of a well drilling, logging and/or production system 10 includes a borehole string 12 that is shown disposed in a wellbore or borehole 14 that penetrates at least one earth formation 16 during a drilling or other downhole operation. As described herein, "borehole" or "wellbore" refers to a single hole that makes up all or part of a drilled well. It is noted that although the embodiments described herein are described in conjunction with vertical wells, they are not so limited, as they could be used with deviated, horizontal and any other boreholes having any selected path through a formation. As described herein, "formations" refer to the various features and materials that may be encountered in a subsurface environment and surround the borehole.

A surface structure or surface equipment 18 includes various components such as a wellhead, derrick and/or rotary table for supporting the borehole string, rotating the borehole string and lowering string sections or other downhole components. In one embodiment, the borehole string 12 is a drillstring including one or more drill pipe sections that extend downward into the borehole 14, and is connected to a drilling assembly 20 that includes a drill bit. The surface equipment 18 also includes pumps, fluid sources and other components to circulate drilling fluid through the drilling assembly 20 and the borehole 14. Although the drillstring and the drill bit is shown in FIG. 1 as being rotated by a surface rotary device, the drill bit may be rotated by a downhole motor such as a mud motor.

In one embodiment, the system 10 includes any number of downhole tools 24 for various processes including formation drilling, geosteering, and formation evaluation (FE) for measuring versus depth and/or time one or more physical quantities in or around a borehole. The tool 24 may be included in or embodied as a bottomhole assembly (BHA) 22, drillstring component or other suitable carrier. A "carrier" as described herein means any device, device component, combination of devices, media and/or member that may be used to convey, house, support or otherwise facilitate the use of another device, device component, and combination of devices, media and/or member. Exemplary non-limiting carriers include drill strings of the coiled tubing type, of the jointed pipe type and any combination or portion thereof. Other carrier examples include casing pipes, wirelines, wireline sondes, slickline sondes, drop shots, downhole subs, bottom-hole assemblies, and drill strings.

The tool 24, the BHA 22 or other portions of the borehole string 12 includes sensor devices configured to measure various parameters of the formation and/or borehole. In one embodiment, the tool 24 is configured as a downhole resistivity measurement tool, such as a logging-while-drilling (LWD) resistivity tool.

Although the system 10 is described in this embodiment as including a drilling assembly, it is not so limited. For example, the system 10 may be configured as a measurement system that includes the tool 24 incorporated in a wireline system or a coiled tubing system.

In one embodiment, the tool 24, BHA 22 and/or sensor devices include and/or are configured to communicate with a processor to receive, measure and/or estimate directional and other characteristics of the downhole components, borehole and/or the formation. For example, the tool 24 is equipped with transmission equipment to communicate with a processor such as a downhole processor 26 or a surface processing unit 28. Such transmission equipment may take any desired form, and different transmission media and connections may be used. Examples of connections include wired, fiber optic, acoustic, wireless connections and mud pulse telemetry.

The processor may be configured to receive data from the tool 24 and/or process the data to generate formation parameter information. In one embodiment, the surface processing unit 28 is configured as a surface drilling control unit which controls various drilling parameters such as rotary speed, weight-on-bit, drilling fluid flow parameters and others. The processor may also be configured to generate commands via appropriate circuitry to the resistivity measurement tool and cause currents and/or magnetic fields to be injected or induced in the formation 16 surrounding the tool. The processor may also detect and/or receive data corresponding to current and/or voltage signals measured via the resistivity measurement tool.

Figure 2:
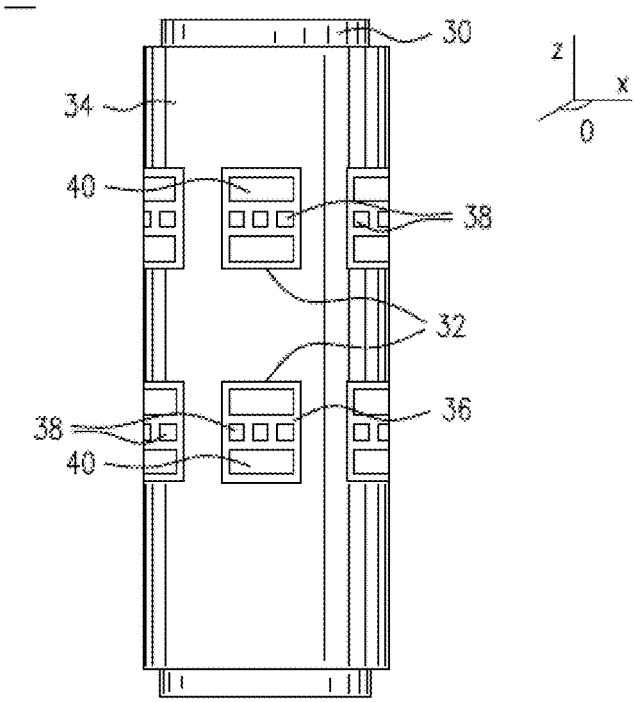
FIG. 2 depicts an embodiment of a resistivity measurement tool configured for use with a rotating downhole component.

FIG. 2 illustrates an embodiment of the tool 24, which is configured to take resistivity measurements during rotation of a downhole component such as a drilling assembly, drill string and/or BHA. Although the tool 24 may be incorporated in any rotating downhole component, in this embodiment, the tool 24 is a LWD resistivity imaging tool.

The tool 24 includes or is mounted to a rotating component 30 such as a length of drill pipe or a BHA component. The rotating component extends in an axial direction, i.e., along a long axis of the rotating component. The axial direction is shown in FIG. 2 as a "z" direction. The tool 24 includes one or more resistivity measurement assemblies or modules 32 embedded in or mounted on the rotating component. The modules may be disposed directly at the rotating component or disposed at a support structure such as a rotating or non-rotating sleeve 34. Each module 32 includes an isolating structure 36 and one or more resistivity sensors 38 that include a capacitive electrode configured to inject an electric current into the formation 16 and/or detect voltage or current to estimate a resistivity of the formation. Each sensor 38 also includes a co-located inductive antenna configured to generate an oscillating magnetic field in the formation and/or measure the magnitude of currents induced in the formation by the magnetic field. The capacitive electrode and inductive antenna are co-located, i.e., located at approximately the same axial and azimuthal or lateral location. Additional electrodes 40 may also be included for transmitting electric current or for acting as guard or focusing electrodes.

The embodiment of FIG. 2 shows a plurality of sensors 38 arrayed as a row in a lateral direction perpendicular to the axial direction (shown as the "x" direction), or arrayed at successive angular or azimuthal locations "θ", however any number and configuration of sensors 38 may be used.

Figure 3:
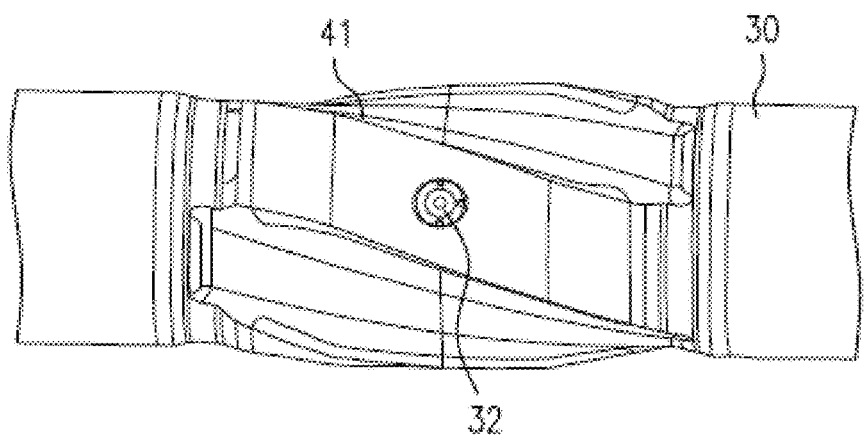
FIG. 3 depicts an embodiment of a resistivity measurement tool configured for use with a rotating downhole component.

FIG. 3 shows another embodiment of the tool 24 configured as part of a drill string or other rotating component. In this embodiment, one or more modules 32 are disposed on a stabilizer component 41 of a drill string. As shown in FIG. 3, the tool 24 may not require an array of measurement modules, but can instead have a single measurement module at a given axial location.

Figure 4:
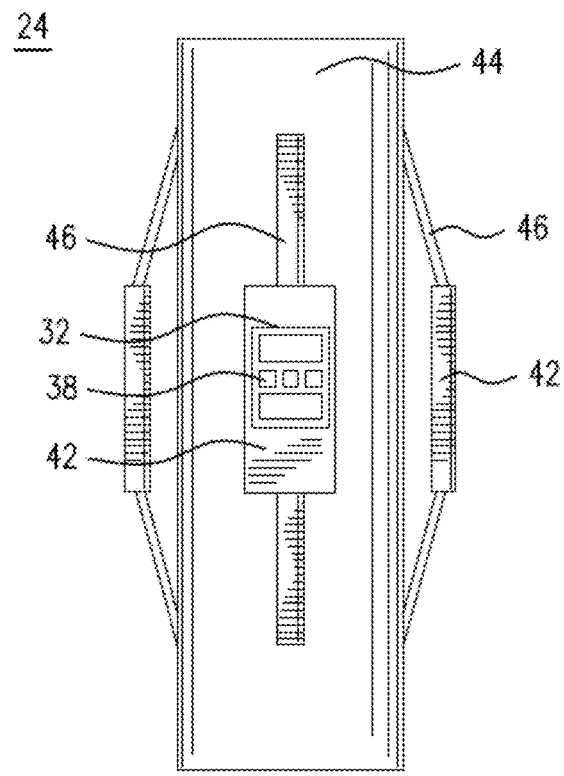
FIG. 4 depicts an exemplary embodiment of non-rotating resistivity measurement tool (e.g., a wireline tool)
Figure 4:
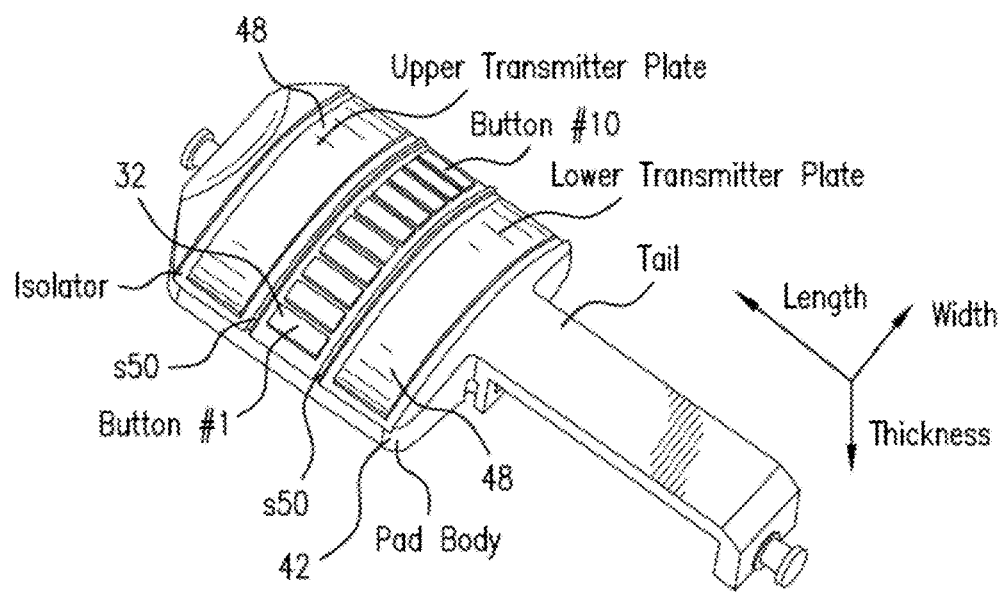

FIG. 4 shows an embodiment of the tool 24 configured as a wireline tool or other non-rotating tool. In this embodiment, the module 32 including the sensors 38 is disposed at a pad 42 made from an electrically insulating material such as a ceramic or polymer material. In this embodiment, the sensors 38 are configured as button electrodes/antennas.

Each pad 42 may be connected to a body 44 of the tool 24 by extendable arms 46 or other mechanisms for extending the module 32 radially and urging the module 32 against the borehole wall and/or mudcake formed on the borehole wall. The pad 42 may include additional components such as electrodes 48 and a non-conductive shield 50 located between the sensors 38 and the electrodes 48.

In one embodiment, the tool 24 is configured to perform measurements within a borehole through which a fluid is circulated that is non-conductive or substantially non-conductive. For example, the fluid is an oil-based drilling fluid made from an oil emulsion or a water-in-oil emulsion, such as an oil-based mud (OBM). Other types of fluids that could be circulated include injection fluids and stimulation fluids such as fracturing fluids.

Figure 5:
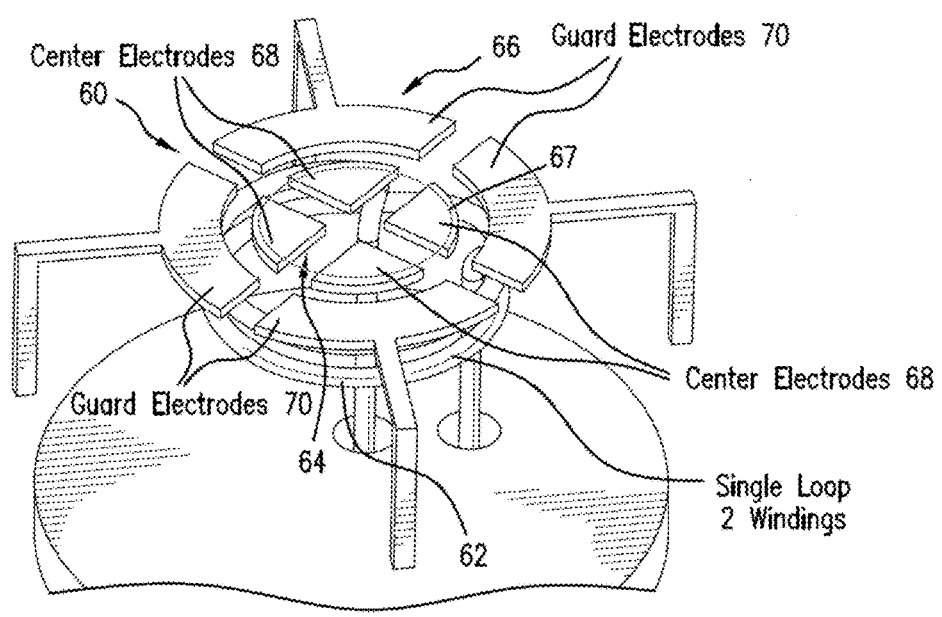
FIG. 5 depicts an embodiment of a combined inductive and capacitive resistivity measurement sensor according to one embodiment.
Figure 6:
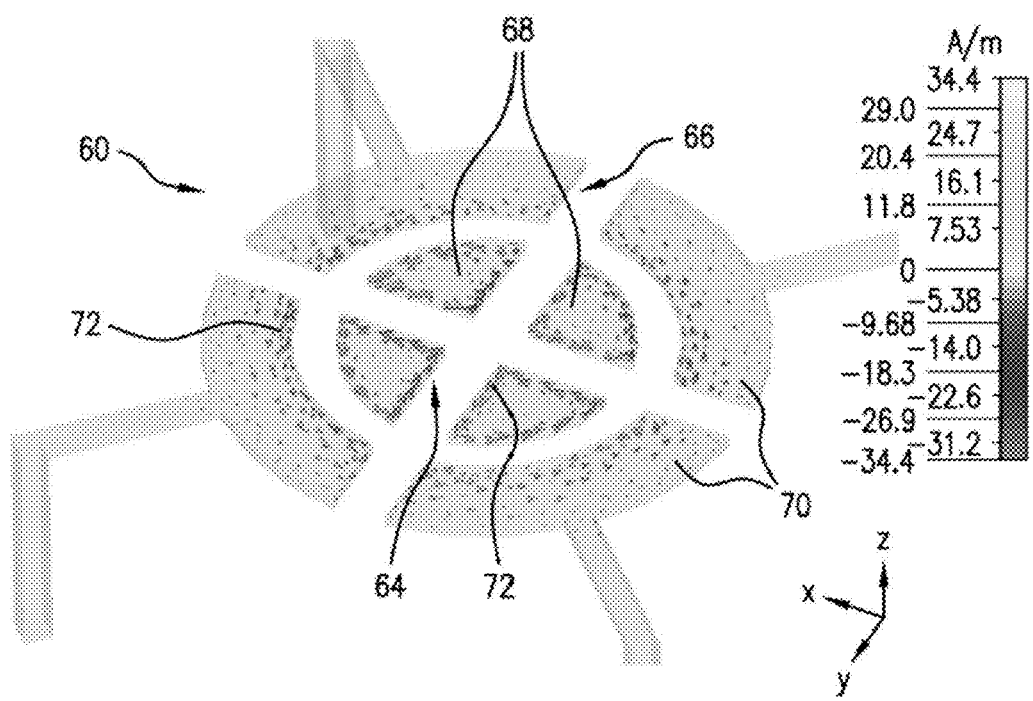
FIG. 6 depicts an embodiment of a capacitive measurement electrode of the sensor of FIG. 5.

FIGS. 5 and 6 show an embodiment of the sensor 38 that includes a capacitive electrode assembly 60 and an inductive antenna 62. The inductive antenna 62 in this embodiment is a single loop sensor having a selected number or windings. For example, the inductive antenna 62 has two windings, although any number (e.g., an integer number) of windings may be formed by the loop.

The capacitive electrode assembly 60 (or at least a central capacitive electrode 64 described below) is co-located above (radially outwardly) the inductive antenna 62 to allow for measuring resistivity using both inductive and capacitive principles from the same axial and angular location. This represents a significant advantage in that both types of measurements can be performed without having to locate the respective types of sensors at different locations. Having sensors at different locations would require that every position of the sensors be determined as a function of time, which can be difficult or impossible, particularly for rotating configurations where the rugosity of the borehole and/or vibrations means that the precise determination of angular position and standoff can be difficult to determine.

In addition to providing dual measurement capabilities, the capacitive electrode assembly 60 performs another important function by acting as a capacitive shield (e.g., by the guard electrode 66; the center electrode 64 may contribute to the shielding function) for the inductive antenna 62 so that capacitive coupling of the antenna 62 and the formation can be avoided. For example, the electrode assembly 60 includes a guard or shield electrode 66 that acts like a guard electrode to prevent capacitive coupling between the antenna 62 and the formation.

The capacitive electrode assembly 60 is configured to ensure that there is no interference between the inductive and capacitive sensors, by having a piecewise construction in which the center capacitive electrode 64 is formed by a plurality of individual constituent electrodes 68 that are unconnected electrically in the region above the antenna 62, i.e., within the path of the magnetic field between the antenna and the formation. This piecewise configuration reduces or eliminates surface eddy currents that could otherwise form in the capacitive electrode and compromise the inductive measurements.

FIG. 5 shows an example of a configuration of the capacitive electrode 60. The electrode includes the center measurement electrode 64 that is formed by the constituent electrodes 68, which are electrically isolated with respect to each other so that there is no direct electrical connection between each other and current cannot directly flow between constituent electrodes 68. The constituent electrodes have no direct or physical connection with each other within the main magnetic field of the antenna 62 (e.g., at least a region located radially above the area defined by an antenna loop).

Figure 7:
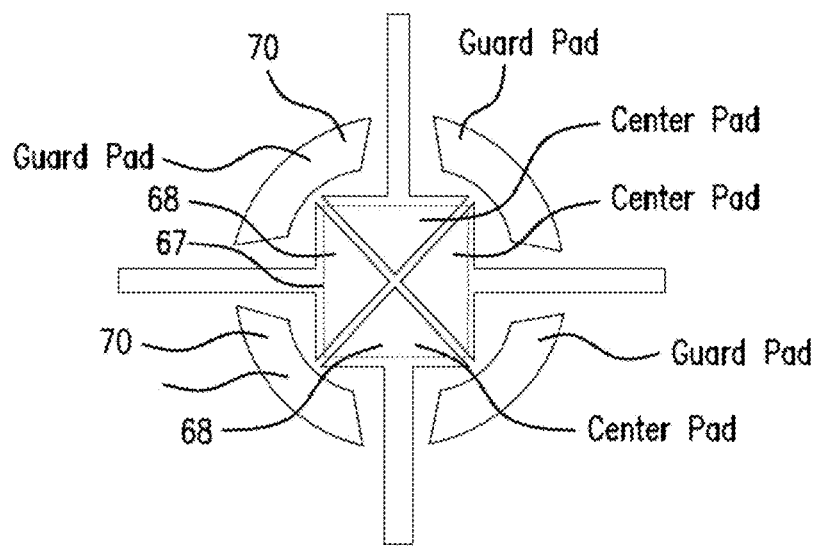
FIG. 7 depicts an embodiment of a capacitive measurement electrode of the sensor of FIG. 5.

The constituent electrodes 68 are thus unconnected so as to prevent the induction of eddy currents across the constituent electrodes 68, e.g., around a contour encompassing the plurality of electrodes. The contour may be a continuous path (e.g., circular or rectangular) formed by the outer edges of the constituent electrodes 68 or other constituent electrodes in a plane parallel to the surface of the electrode 60 (e.g., in the x-y plane of FIG. 6). Examples of a contour 67 are shown in FIGS. 5 and 7. Although the constituent electrodes are physically unconnected, they may be electrically connected to a measurement circuit. For example, an electrical connection (e.g., at or near the center point of the electrode 60) may be formed to connect the constituent electrodes 68 to a measurement circuit.

In this example, the center electrode 64 is circular and is divided into four unconnected pie-shaped parts (i.e., the constituent electrodes 68). In one embodiment, the center electrode 64 is surrounded by the guard electrode 66, which may also be divided into multiple parts, shown in this example as constituent guard electrodes 70. It is noted that the number and configuration of constituent electrodes is not limited to the embodiments described herein, as other shapes and numbers of constituent electrodes may be used as desired.

FIG. 6 demonstrates how eddy currents that would otherwise be induced are prevented or reduced by the configuration of FIG. 5. FIG. 6 shows simulated surface eddy currents 72 (represented by arrows on the surface of the central and guard electrode) produced by means of the magnetic field generated by the antenna 62. As is evident, no closed loop of eddy currents can occur across the entire central electrode or guard electrode.

Figure 8A:
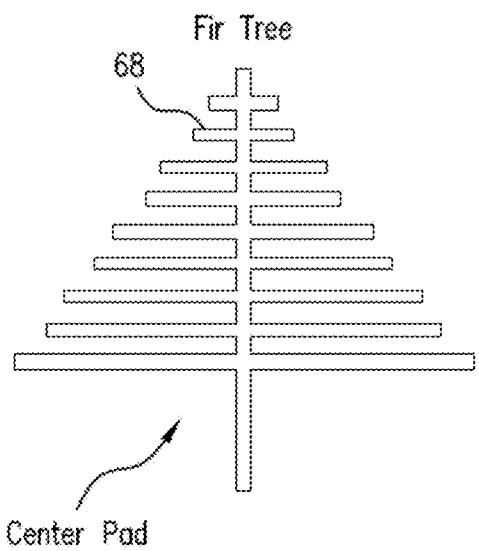
FIGS. 8A and 8B collectively depicts an example of one or more constituent electrodes of the capacitive measurement electrode of FIG. 7.
Figure 8B:
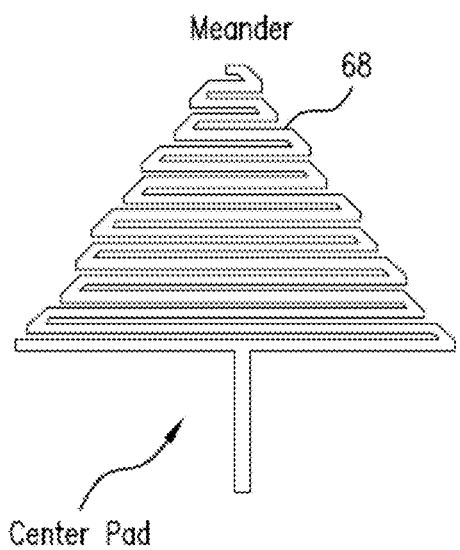

FIGS. 7 and 8 illustrate another embodiment of the center electrode. In this embodiment, the center electrode 64 is generally rectangular and is divided into four triangle shaped constituent electrodes.

In order to further disrupt and weaken eddy currents in the capacitive electrode assembly 60, the constituent electrodes 68 can be further divided or broken up to further reduce the ability of eddy currents to form. FIG. 8 shows an example in which the constituent electrodes 68 of FIG. 7 are further divided into slices or other components. These components may be of any shape of form suitable to further reduce the extent of eddy currents in the capacitive electrode. In this example, each constituent is formed as a series of slices or is formed to follow a meandering path as shown in FIG. 7.

The combined inductive and capacitive resistivity sensors described herein may be used in a method of measuring electrical characteristics of a formation. An embodiment of a method includes a number of stages discussed further below. The method is described herein in conjunction with the tool 24, although the method may be performed in conjunction with any number and configuration of processors, sensors and tools. In one embodiment, the method includes the execution of all of the following stages in the order described. However, certain stages may be omitted, stages may be added, or the order of the stages changed.

In a first stage, the tool 24 is lowered in a borehole in an earth formation. The tool 24 may be lowered, for example, during a drilling operation, LWD operation or via a wireline. In a second stage, a control circuit is used to apply an oscillating voltage or current to the inductive antenna 62 according to a selected frequency. The inductive antenna 62 in turn generates an oscillating magnetic field in the earth formation. The control circuit or a different measurement circuit detects a response of the antenna 62 to currents induced in the formation. In a third stage, the control circuit (or a different control circuit) injects an oscillating measurement current into the formation via the capacitive electrode assembly 60 and detects a resulting signal by the capacitive measurement electrode. For example, current can be injected by the capacitive electrode assembly 60 and then the resulting signal can be measured by measuring the (e.g., complex) center electrode 64 voltage, or a voltage can be applied and the resulting signal can be measured by measuring the center electrode 64 current. The measurement signal magnitude can be constant and does not need to change.

The second stages and third stages may be performed sequentially or alternatively (or in any desired manner), or may be performed simultaneously, e.g., by using a different frequency for the inductive antenna 62 and the electrode assembly 60. In a fourth stage a resistivity of the formation is estimated based on detecting the signal and/or detecting the change in the measurement current.

Embodiments described herein provide an effective resistivity measurement tool that incorporates both inductive (e.g., single loop) and capacitive (e.g., guarded button) sensors for both wireline and LWD imaging applications. Such combined sensors overcome various shortcomings inherent in the respective physical principles of each type of sensing.

Figure 9:
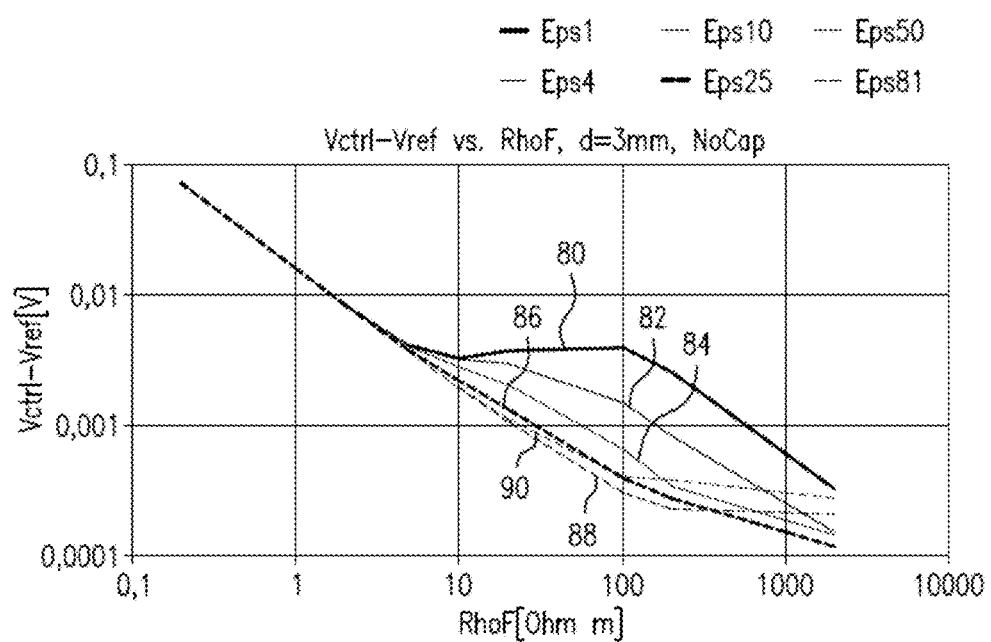
FIG. 9 depicts results of simulation results for an inductive sensor antenna.
Figure 10:
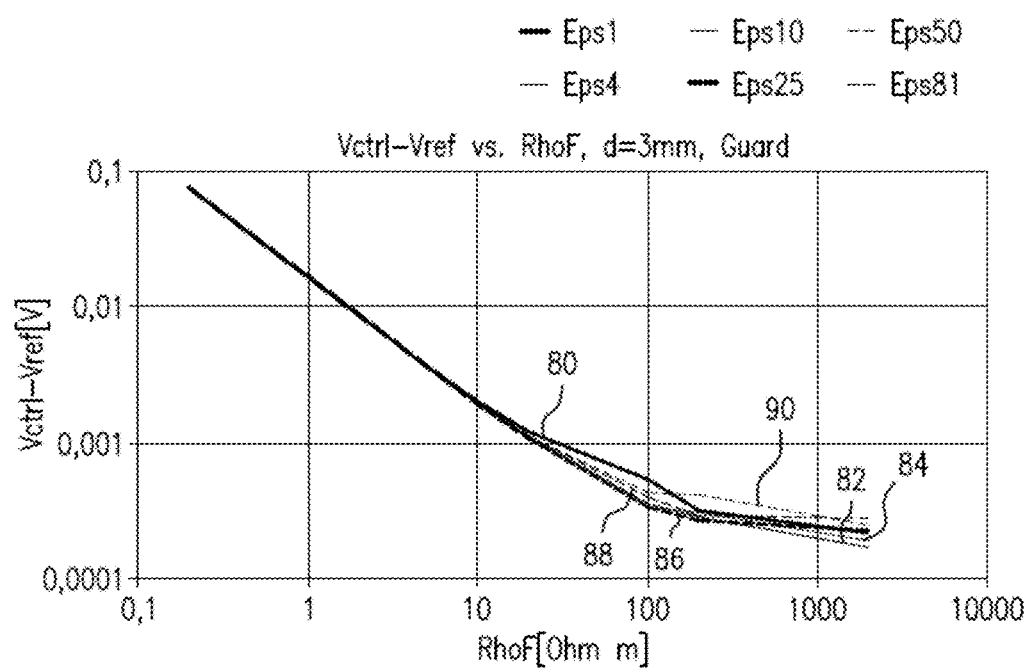
FIG. 10 depicts results of tests of the inductive sensor antenna of FIG. 8 in conjunction with a guard electrode according to embodiments described herein.
Figure 11:
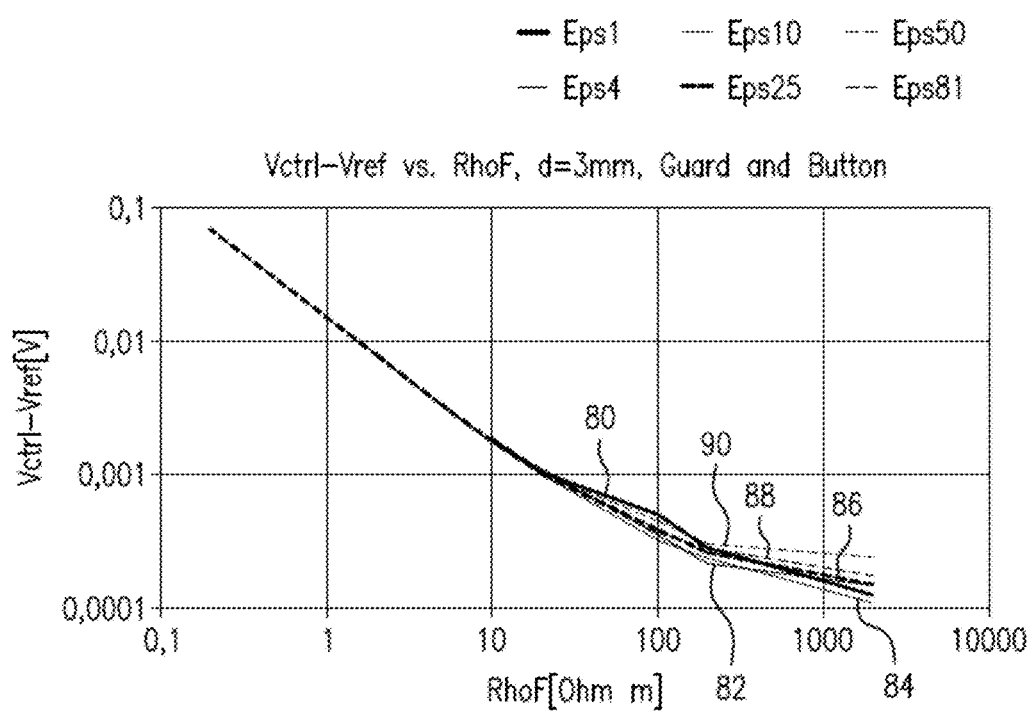
FIG. 11 depicts results of tests of the inductive sensor antenna of FIG. 8 in conjunction with a capacitive measurement electrode according to embodiments described herein.

FIGS. 9-11 illustrate graphs that show results of simulations that demonstrate the effectiveness of the co-located capacitive and inductive sensors described herein. As discussed further below, these tests demonstrate that the capacitive sensor configured according to embodiments described herein can be configured in conjunction with the inductive sensor as described herein without negatively effecting the functionality of the inductive sensor, and can also be used effectively as a capacitive shield.

In these tests, a standoff of 3 mm was used, and drilling fluid (e.g., oil-based mud) was represented by air. The formation resistivity was varied from 0.2 to 2000 Ωm and the formation relative permittivity from 1 to 81. A signal amplitude from an inductive sensor (e.g., single loop antenna), applied via an oscillator circuit, was controlled by applying a control voltage $V_{ctrl}$ to the inductive antenna 62 and keeping the control voltage constant with respect to the changing surrounding resistivity. A voltage value was determined by $V_{ctrl}-V_{ref}$, where $V_{ref}$ is the control voltage of the antenna in free air. The measured voltage is represented by curves showing the dependency of the measured resistivity relative to simulated formation resistivities. In these examples, curves 80, 82, 84, 86, 88 and 90 represent curves associated with formations having relative permittivities of 1, 4, 10, 25, 50 and 81, respectively.

FIG. 9 shows the results of the test using a single loop inductive sensor operated without the center or guard electrode of the capacitive/galvanic sensor. FIG. 10 shows the results of the test using the single loop sensor operated only with the guard electrode of the capacitive/galvanic electrode assembly. FIG. 11 shows the results of the test using the single loop sensor operated with both the center and guard electrode of the capacitive/galvanic electrode assembly.

As demonstrated by these results, lower resistivities (below about 5 Ωm) are well resolvable using only the inductive loop without a guard electrode. However, for resistivities above 5 Ωm, the influence of formation permittivity becomes visible. This effect can be minimized by the guard electrode 66 as shown in FIG. 10, which demonstrates that the segmented guard electrode represents an effective capacitive shield for the loop. Furthermore, FIG. 11 demonstrates that the use of the center electrode 60 does not have a significant influence on the functionality of the single loop sensor, thereby showing that the center electrode and/or the assembly 60 can be effectively utilized as a capacitive sensor without negatively affecting the functionality of the loop sensor.

Figure 12:
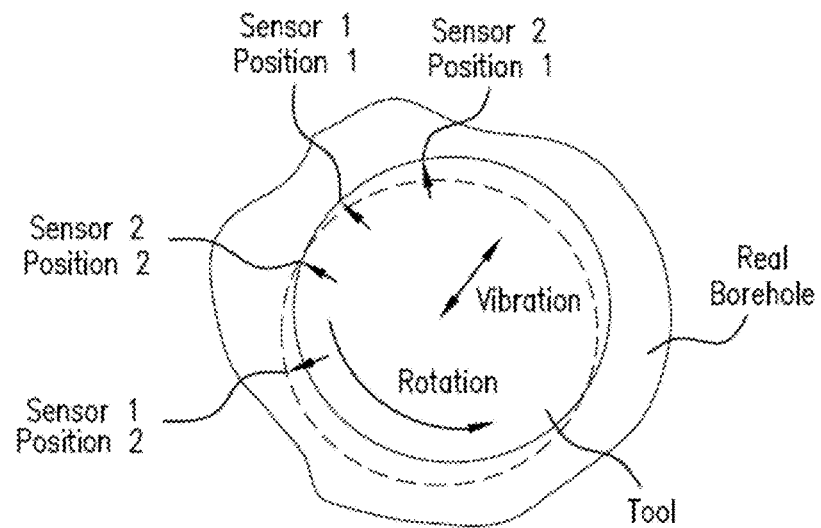
FIG. 12 depicts effects of borehole and downhole component variations that can effect resistivity measurements.
Figure 12:
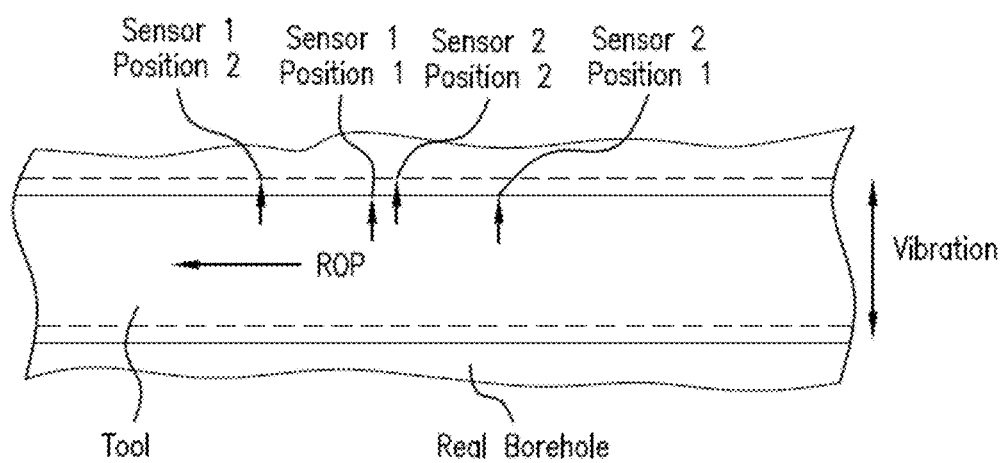

FIG. 12 demonstrates another significant advantage of the combined inductive and capacitive sensors described herein. A potential configuration for performing both inductive and capacitive resistivity measurements using a single tool is a tool on which the inductive sensor and the capacitive sensor are mounted at different locations. In order to determine the precise location for each measurement, the responses could be measured and later superimposed with respect to a desired position that was passed by the sensors at different points of time. This approach would require that every position of a sensor be recalculated as vertical and azimuthal coordinates as well as standoff from a borehole wall.

However, even supposing that points in time could be identified for each sensor that correlates the measurements to the same location, it is likely that the standoff will not be the same due to factors such as borehole rugosity and tool motion. For example, as shown FIG. 12, vibrations of a tool during rotation may result in changes in standoff, causing the result that the standoff when the first sensor (Sensor 1) is at a location (e.g., position 1 or position 2) may not be the same as the standoff when the second sensor (Sensor 2) reaches the same location because of the time delay due to the different locations of each sensor on the tool. Likewise, standoff variation due to vibration, irregular borehole shape and rate of penetration would likely result in a different standoff for each sensor at a given location due to the delay in time between each sensor reaching the location.

Thus, the embodiments described herein provide a number of significant advantages due to the ability to configure both types of sensors at the same location. One such advantage is that the co-located sensors ensure that the same standoff and other borehole features will be experienced as each sensor performs its respective measurements. Furthermore, the embodiments are advantageous in that they reduce the amount of space needed and reduce the complexity of the physical configuration, and can reduce the amount of processing (e.g., calculating time delays and coordinates) required to acquire measurements of a formation.

Generally, some of the teachings herein are reduced to an algorithm that is stored on machine-readable media. The algorithm is implemented by a computer and provides operators with desired output.

The systems described herein may be incorporated in a computer coupled to the tool 24. Exemplary components include, without limitation, at least one processor, storage, memory, input devices, output devices and the like. As these components are known to those skilled in the art, these are not depicted in any detail herein. The computer may be disposed in at least one of a surface processing unit and a downhole component.

In support of the teachings herein, various analyses and/or analytical components may be used, including digital and/or analog systems. The system may have components such as a processor, storage media, memory, input, output, communications link (wired, wireless, pulsed mud, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Set forth below are some embodiments of the foregoing disclosure:

Embodiment 1. A system for measuring electric characteristics of an earth formation, comprising: a carrier configured to be disposed in an earth formation; an inductive measurement assembly including an antenna configured to generate an oscillating magnetic field in the earth formation and measure a resistivity of the formation by detecting a signal in response to currents induced in the formation by the magnetic field; and a capacitive measurement assembly including a capacitive measurement electrode configured to detect a signal in response to a measurement current injected into the formation, the capacitive measurement electrode disposed at least approximately at the same axial and angular location of the carrier as the antenna and disposed between the antenna and the formation and in a path of the magnetic field, the capacitive measurement electrode formed from a plurality of constituent electrodes that are electrically isolated from each other so as to prevent induction of eddy currents across the plurality of electrodes.

Embodiment 2. The system of embodiment 1, wherein the plurality of constituent electrodes have no direct electrical connection therebetween.

Embodiment 3. The system of any prior embodiment, wherein the plurality of constituent electrodes are physically unconnected so as to prevent induction of eddy currents around a contour encompassing the plurality of constituent electrodes.

Embodiment 4. The system of any prior embodiment, wherein the inductive measurement assembly includes at least one antenna, the plurality of measurement electrodes disposed in a region above the at least one antenna in which the magnetic field is formed.

Embodiment 5. The system of any prior embodiment, wherein the capacitive measurement assembly includes a guard electrode surrounding the capacitive measurement electrode.

Embodiment 6. The system of any prior embodiment, wherein the capacitive measurement electrode is divided into a plurality of constituent electrodes that are each connected to a measurement circuit.

Embodiment 7. The system of any prior embodiment, wherein the plurality of constituent electrodes is formed as at least one of: a series of slices and an elongated electrode structure following a meandering path.

Embodiment 8. The system of any prior embodiment, wherein the carrier is configured to perform aspects of a logging while drilling (LWD) operation.

Embodiment 9. The system of any prior embodiment, further comprising a processor configured to control an operational parameter of the LWD operation based on signals received from at least the capacitive measurement electrode.

Embodiment 10. The system of any prior embodiment, wherein the carrier includes a pad made from an electrically insulating material, the pad including a plurality of buttons, each of the plurality of buttons including the inductive measurement assembly and the capacitive measurement assembly.

Embodiment 11. A method of measuring electric characteristics of an earth formation, the method comprising: disposing a carrier in a borehole in an earth formation, the carrier including a measurement tool having an inductive measurement assembly and a capacitive measurement assembly, the inductive measurement assembly including an antenna, the capacitive measurement assembly including a capacitive measurement electrode disposed at least approximately at the same axial and angular location of the carrier as the antenna and disposed between the antenna and the formation and in a path of a magnetic field generated by the antenna, the capacitive measurement electrode formed from a plurality of constituent electrodes that are electrically isolated from each other so as to prevent induction of eddy currents across the plurality of electrodes; generating an oscillating magnetic field in the earth formation by the antenna and detecting a signal in response to currents induced in the formation by the magnetic field; injecting a measurement current into the formation and detecting a resulting signal by the capacitive measurement electrode; and estimating a resistivity of the formation based on detecting the signal and detecting the resulting signal.

Embodiment 12. The method of any prior embodiment, wherein the plurality of constituent electrodes have no direct electrical connection therebetween.

Embodiment 13. The method of any prior embodiment, wherein the plurality of constituent electrodes are physically unconnected so as to prevent induction of eddy currents around a contour encompassing the plurality of constituent electrodes.

Embodiment 14. The method of any prior embodiment, wherein the inductive measurement assembly includes at least one antenna, the plurality of measurement electrodes disposed in a region above the at least one antenna in which the magnetic field is formed.

Embodiment 15. The method of any prior embodiment, wherein the capacitive measurement assembly includes a guard electrode surrounding the capacitive measurement electrode.

Embodiment 16. The method of any prior embodiment, wherein the capacitive measurement electrode is divided into a plurality of constituent electrodes that are each connected to a measurement circuit.

Embodiment 17. The method of any prior embodiment, wherein the plurality of constituent electrodes is formed as at least one of: a series of slices and an elongated electrode structure following a meandering path.

Embodiment 18. The method of any prior embodiment, wherein the carrier is configured to perform aspects of a logging while drilling (LWD) operation.

Embodiment 19. The method of any prior embodiment, further controlling an operational parameter of the LWD operation based on the resistivity of the formation.

Embodiment 20. The method of any prior embodiment, wherein the carrier includes a pad made from an electrically insulating material, the pad including a plurality of buttons, each of the plurality of buttons including the inductive measurement assembly and the capacitive measurement assembly.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The teachings of the present disclosure may be used in a variety of well operations. These operations may involve using one or more treatment agents to treat a formation, the fluids resident in a formation, a wellbore, and/or equipment in the wellbore, such as production tubing. The treatment agents may be in the form of liquids, gases, solids, semi-solids, and mixtures thereof. Illustrative treatment agents include, but are not limited to, fracturing fluids, acids, steam, water, brine, anti-corrosion agents, cement, permeability modifiers, drilling muds, emulsifiers, demulsifiers, tracers, flow improvers etc. Illustrative well operations include, but are not limited to, hydraulic fracturing, stimulation, tracer injection, cleaning, acidizing, steam injection, water flooding, cementing, etc.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited.

What is claimed is:

1. A system for measuring electric characteristics of an earth formation, comprising:
    a carrier configured to be disposed in an earth formation;
    an inductive measurement assembly including an antenna wherein the antenna is configured to generate an oscillating magnetic field in the earth formation and measure a resistivity of the formation by detecting a signal in response to currents induced in the formation by the magnetic field; and
    a capacitive measurement assembly including a capacitive measurement electrode configured to detect a signal in response to a measurement current injected into the formation by the capacitive measurement electrode, the capacitive measurement electrode disposed at least approximately at the same axial and angular location of the carrier as the antenna and disposed between the antenna and the formation and in a path of the magnetic field, the capacitive measurement electrode formed from a plurality of constituent electrodes that are electrically isolated from each other so as to prevent induction of eddy currents across the plurality of electrodes.

2. The system of claim 1, wherein the plurality of constituent electrodes have no direct electrical connection therebetween.

3. The system of claim 1, wherein the plurality of constituent electrodes are physically unconnected so as to prevent induction of eddy currents around a contour encompassing the plurality of constituent electrodes.

4. The system of claim 1, wherein the inductive measurement assembly includes a plurality of antennas, the plurality of measurement electrodes disposed in a region above the antennas in which the magnetic field is formed.

5. The system of claim 1, wherein the capacitive measurement assembly includes a guard electrode surrounding the capacitive measurement electrode.

6. The system of claim 5, wherein the capacitive measurement electrode is divided into a plurality of constituent electrodes that are each connected to a measurement circuit.

7. The system of claim 1, wherein the plurality of constituent electrodes is formed as at least one of: a series of slices and an elongated electrode structure following a meandering path.

8. The system of claim 1, wherein the carrier is configured to perform aspects of a logging while drilling (LWD) operation.

9. The system of claim 8, further comprising a processor configured to control an operational parameter of the LWD operation based on signals received from at least the capacitive measurement electrode.

10. The system of claim 1, wherein the carrier includes a pad made from an electrically insulating material, the pad including a plurality of buttons, each of the plurality of buttons including a respective inductive measurement assembly and a respective capacitive measurement assembly.

11. A method of measuring electric characteristics of an earth formation, the method comprising:
    disposing a carrier in a borehole in an earth formation, the carrier including a measurement tool having an inductive measurement assembly and a capacitive measurement assembly, the inductive measurement assembly including an antenna, the capacitive measurement assembly including a capacitive measurement electrode disposed at least approximately at the same axial and angular location of the carrier as the antenna and disposed between the antenna and the formation and in a path of a magnetic field generated by the antenna, the capacitive measurement electrode formed from a plurality of constituent electrodes that are electrically isolated from each other so as to prevent induction of eddy currents across the plurality of electrodes;
    generating an oscillating magnetic field in the earth formation using the antenna and detecting, with the antenna, a signal in response to currents induced in the formation by the magnetic field;
    injecting, with the capacitive measurement electrode, a measurement current into the formation and detecting, with the capacitive measurement electrode, a resulting signal; and
    estimating a resistivity of the formation based on detecting the signal and detecting the resulting signal.

12. The method of claim 11, wherein the plurality of constituent electrodes have no direct electrical connection therebetween.

13. The method of claim 11, wherein the plurality of constituent electrodes are physically unconnected so as to prevent induction of eddy currents around a contour encompassing the plurality of constituent electrodes.

14. The method of claim 11, wherein the inductive measurement assembly includes at least one antenna, the plurality of measurement electrodes disposed in a region above the at least one antenna in which the magnetic field is formed.

15. The method of claim 11, wherein the capacitive measurement assembly includes a guard electrode surrounding the capacitive measurement electrode.

16. The method of claim 15, wherein the capacitive measurement electrode is divided into a plurality of constituent electrodes that are each connected to a measurement circuit.

17. The method of claim 11, wherein the plurality of constituent electrodes is formed as at least one of: a series of slices and an elongated electrode structure following a meandering path.

18. The method of claim 11, wherein the carrier is configured to perform aspects of a logging while drilling (LWD) operation.

19. The method of claim 18, further controlling an operational parameter of the LWD operation based on the resistivity of the formation.

20. The method of claim 11, wherein the carrier includes a pad made from an electrically insulating material, the pad including a plurality of buttons, each of the plurality of buttons including the inductive measurement assembly and the capacitive measurement assembly.

* * * * *